OPERATIONAL AMPLIFIER PROVIDING LOW INPUT CURRENT AND ENHANCED HIGH FREQUENCY GAIN

Filed Aug. 21, 1967

INVENTOR.

RICHARD S. BURWEN

BY

Alfred W. Barber

ATTORNEY

Oct. 6, 1970 R. S. BURWEN 3,533,002

OPERATIONAL AMPLIFIER PROVIDING LOW INPUT CURRENT AND ENHANCED HIGH FREQUENCY GAIN

Filed Aug. 21, 1967 2 Sheets-Sheet 2

INVENTOR.

RICHARD S. BURWEN

BY

Alfred W. Barber

ATTORNEY

United States Patent Office 3,533,002
Patented Oct. 6, 1970

3,533,002

OPERATIONAL AMPLIFIER PROVIDING LOW INPUT CURRENT AND ENHANCED HIGH FREQUENCY GAIN

Richard S. Burwen, Lexington, Mass., assignor to Analog Devices, Inc., Cambridge, Mass., a corporation of Massachusetts Filed Aug. 21, 1967, Ser. No. 667,313
Int. Cl. H03f *3/04, 3/38*
U.S. Cl. 330—9 7 Claims

ABSTRACT OF THE DISCLOSURE

The present invention comprises a differential operational amplifier having a differential input stage characterized by low input current but low bandwidth characteristics. The first two stages of this amplifier comprising four transistors is floated on the common emitters of the third stage pair of transistors and is powered through a constant current transistor source and across a voltage regulating Zener diode. The input of the device is coupled through a pair of capacitors to the third stage pair forming a composite amplifier having low input current and good high frequency gain characteristics.

BACKGROUND OF THE INVENTION

Field of the invention

The present invention concerns cascaded differently coupled stage amplifiers (330—152+).

Describe the prior art

In a differential DC amplifier intended for use as an operational amplifier the input stage is generally a differential pair of transistors. In order to minimize the input current to such a stage the input transistors are often operated at very low collector currents. This is accomplished by using very high values of collector load resistance. However, when this is done the stage has poor high frequency response i.e. low bandwidth, increasing the collector current by lowering the value of the collector resistors improves the high frequency response but only at a sacrifice in input current characteristics. In the past a compromise has been made between input current and bandwidth.

SUMMARY

According to the present invention the input stage of a differential amplifier is operated at very low collector current thereby achieving very low input current characteristics, and a pair of capacitors is used to carry high frequency signals to a mid-stage in the amplifier for achieving a very wide bandwidth characteristic. Additionally, the first two stages of the amplifier are floated on the common emitters of the mid-stage and are supplied with power through a constant current device and this power is voltage regulated by a Zener diode. This method of supplying power to the input stages provides improved DC stability of the input stages where the stability characteristics of the composite amplifier are mainly determined.

Accordingly, one object of the present invention is to provide a differential transistor amplifier exhibiting both a very low input current and a wide bandwidth.

Another object is to provide an amplifier having improved DC stability characteristics.

These and other objects will be apparent from the detailed description of the figures of the drawing.

DESCRIPTION OF THE PREFERRED EMBODIMENTS

Figure 1:
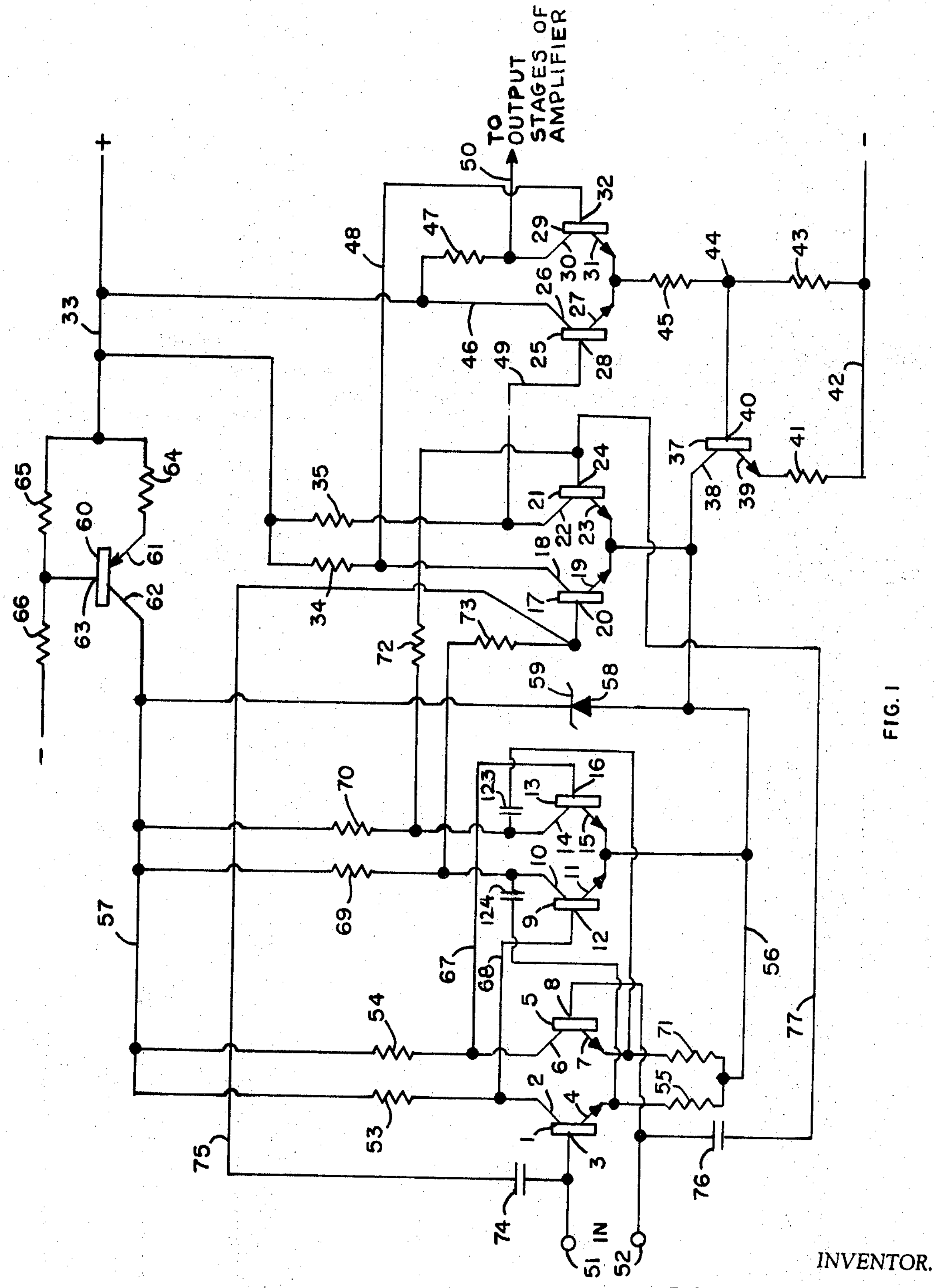
FIG. 1 is a schematic circuit diagram of one form of the present invention.

FIG. 7 is a schematic circuit diagram of a differential amplifier embodying the present invention. The input stage uses transistors 1 and 5 including collectors 2 and 6, bases 3 and 8 and emitters 4 and 7 respectively. Base 3 is connected to a first input terminal 51 and base 8 is connected to a second input terminal 52. Collector 2 is connected through a load resistor 53 to positive line 57 and collector 6 is connected through a load resistor 54 to the same positive line 57. Emitters 4 and 7 are connected through emitter resistors 55 and 71 respectively and their common point is returned to negative line 56.

The second differential stage uses transistors 9 and 13 having collectors 10 and 14, emitters 11 and 15 and bases 12 and 16 respectively. Collectors 10 and 14 are connected through load resistors 69 and 70 respectively to positive line 57 while emitters 11 and 15 are connected to negative line 56. The first and second stages are cascaded by the connecting leads 67 and 68 connecting collector 6 with base 16 and collector 2 with base 12 respectively. Capacitor 123 is connected from collector 14 is emitter 7 and capacitor 124 is connected from collector 10 to emitter 4 in order to insure stability.

The third differential stage uses transistors 17 and 21 having collectors 18 and 22, emitters 19 and 23 and bases 20 and 24 respectively. Collectors 18 and 22 are connected through load resistors 34 and 35 respectively to positive line 33 and emitters 19 and 23 are connected together and over lead 36 to collector 38 of the constant current source transistor 37.

The fourth differential stage uses transistors 25 and 29 having collectors 26 and 30, emitters 27 and 31 and bases 26 and 32 respectively. Collector 26 is connected directly to positive line 33 by means of lead 46 and collector 47 is connected through load resistor 47 to positive line 33. Emitters 27 and 31 are connected together and through the common emitter resistor consisting of resistors 45 and 43 in series to negative line 42. An output is taken from collector 30 over lead 50 which will generally go to a differential output stage or other utilization means.

The constant current feed circuit provided by transistor 37 to emitters 19 and 23 is completed by returning emitter 39 through resistor 41 to negative line 42 and by connecting base 40 to junction 44 between resistors 43 and 45. The positive bias on line 57 and the negative bias on line 56 are established by Zener diode 58–59 connected therebetween; and by constant current supplied by transistors 60 and 37. The line 56 is connected to collector 38. Transistor 60 is connected as a constant current source. Resistors 65 and 66 are connected in series from positive line 33 to a negative line and the potential at the junction between resistors 65 and 66 is applied to base 63. Emitter 61 is connected to positive line 33 through resistor 64 and collector 62 is connected to supply constant current to positive line 57. These connections supply a well regulated voltage as determined by the Zener voltage of Zener diode 58–59. This provides a potential between lines 56 and 57 which "floats" on the emitter supply of transistors 17 and 21 so that the operating potentials and signal excursions of the first two differential stages is held in the mid-range between the positive voltage on line 33 and the negative voltage on line 42.

The fourth differential stage is cascaded from the third differential stage by leads 48 and 49 connecting collector 18 with base 32 and collector 22 with base 28 respectively.

The output of the second differential stage is applied to the input of the third differential stage by means of resistors 72 and 73 coupling collector 14 with base 24 and collector 10 with base 20 respectively. Since the phase of the signals passing through a transistor amplifier stage employing base input and collector output reverses, the signals from input terminals 51 and 52 have been reversed twice in reaching bases 20 and 24 and therefore will again be in phase. Now a coupling path from these input terminals to these bases which provides an in-phase path will provide signals which are in-phase i.e. will reenforce the signals passing through the first two differential stages. Thus, capacitors 74 connected over lead 75 from input terminal 51 to base 20 capacitor 76 connected over lead 77 from input terminal 52 to base 24 will provide in-phase reenforcing signals at bases 20 and 24 respectively. Since the coupling impedance of these capacitors decreases as the signal frequencies are increased, the coupling around the first two stages increases with frequency.

The first differential stage comprising transistors 1 and 5 is provided with collector load resistors 53 and 54 and emitter resistor 55 having relatively high values so that this input stage operates at very low values of collector current and consequently at very low values of current to bases 3 and 8. The base currents are substantially equal to the collector currents divided by the current gains at the operating current levels. These very low current levels provide an input differential stage which draws very little current from any input connected across terminals 51 and 52. However, these high values of collector and emitter resistance also results in a narrow frequency response since the higher frequencies will be attenuated by the collector capacitances shunting the collector load resistors 53 and 54. The high frequency response is restored by signal paths through capacitors 74 and 76 to bases 20 and 24 as described above. The third and fourth differential amplifier stages are designed to provide wide band response. In this way a differential amplifier has been provided characterized by very low input current and wide band response.

Figure 2:
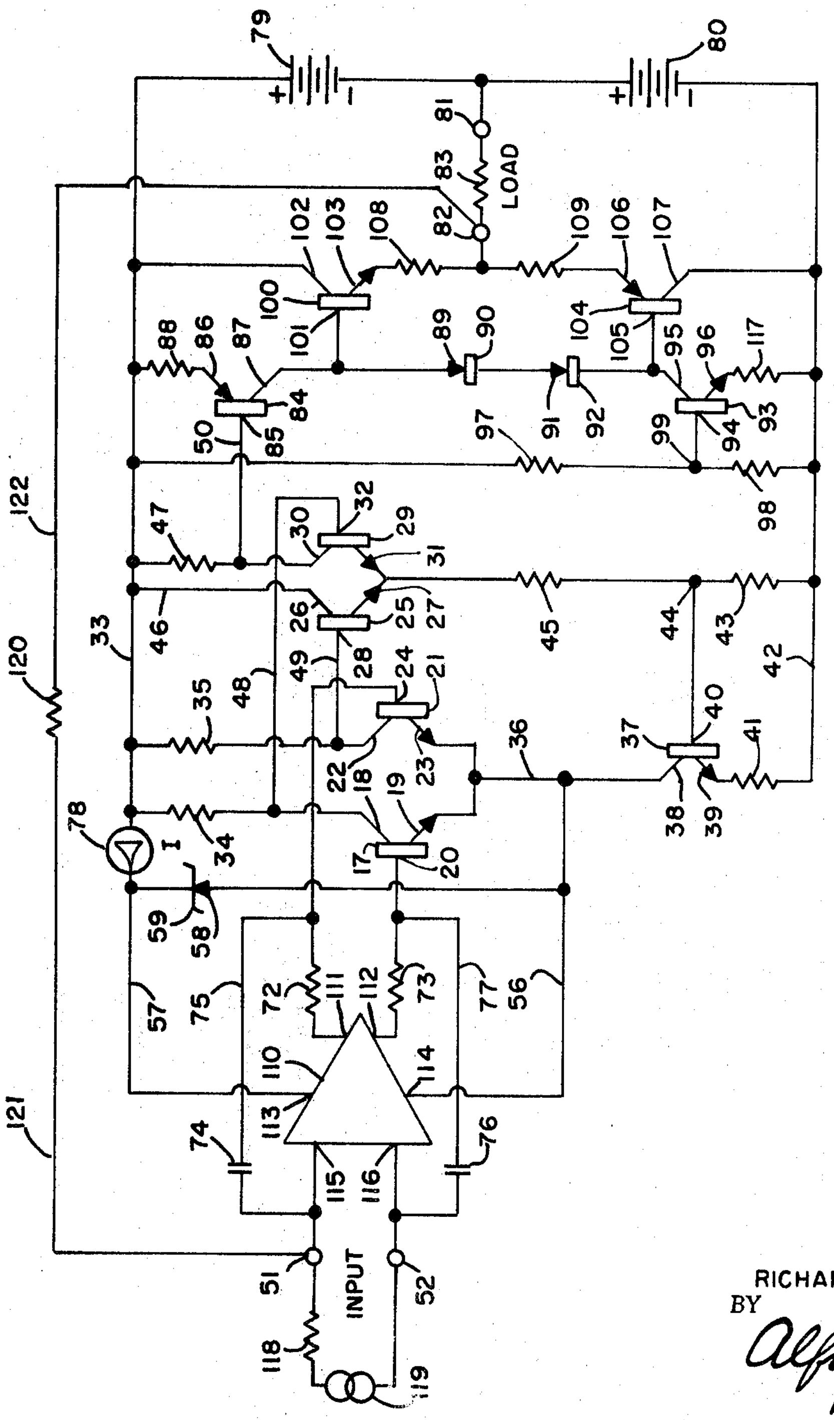
FIG. 2 is a schematic block circuit diagram of one form of the present invention.

FIG. 2 is a schematic and block circuit diagram of one form of the present invention. The first two differential stages of FIG. 1 comprising transistors 1, 5, 9 and 13 are represented in a more general form in FIG. 2 by amplifier 110. Amplifier 110 may be taken to represent any suitable differential input, differential output amplifier wherein input from terminal 51 applied to input terminal 115 is amplified wtih narrow band characteristics and is fed out at the in phase output terminal 111 and through resistor 72 to base 24 of transistor 21; and input from terminal 52 applied to input terminal 116 is similarly amplified and fed out at the in phase output terminal 112 and through resistor 73 to base 20 of transistor 17. The bias for amplifier 110 is derived by constant current from positive line 33 passing through constant current regulator 78 providing a voltage across Zener diode 58–59 which is applied over lead 57 to the positive bias input terminal 113 and over lead 56 to the negative bias input terminal 114. The functioning and circuit details of transistors 17, 21, 28 and 29 and coupling capacitors 74 and 76 feeding high frequency signals around amplifier 110 are described above in connection with FIG. 1.

FIG. 2 also shows a two stage complementary pair output circuit between transistor 29 and a load 83 connected between load terminals 81 and 82. Driver transistors 84 and 93 are followed by output power transistors 100 and 104. Base 85 of transistor 84 is connected to collector 30 by lead 50; emitter 86 is connected through emitter resistor 88 to positive lead 33; and collector 87 is connected to base 101 of output transistor 100. Base 94 is connected to junction 99 of a voltage divider formed of resistors 97 and 98 bridged from positive line 33 to negative line 42; emitter 96 is connected through emitter resistor 117 to negative line 42; and collector 95 is connected to base 105 of output transistor 104. A forward bias is assured on baes 101 and 105 by diodes 89–90 and 91–92 connected in forward direction between bases 101 and 105. Output transistors 100 and 104 are connected with collector 102 connected to positive lead 33; emitter 103 connected through current limiting emitter resistor 108 to output terminal 82; collector 107 is connected to negative lead 42; and emitter 106 is connected through current limiting emitter resistor 109 to output terminal 82. The output signals appear between terminals 81 and 82 and across load 83. Terminal 81 is connected to the center of the bias voltage supply which may be any suitable source such as batteries 79 and 80 supplying positive lead 33 and negative lead 42 respetcively. Thus, this amplifier provides highly amplified signals of a differential nature and over an extended frequency range to load terminals 81 and 82 in response to input signals applied to input terminals 51 and 52. In particular, this amplifier is adapted to operate as an operational amplifier with input signals from source 119 applied to input terminals 51 through input resistor 118 and feedback from output terminal 82 over lead 122, through feedback resistor 120 and over lead 121 to input terminal 51. The closed loop gain with this input resistor 118 and feedback resistor 120 will be substantially equal to the value in ohms of resistor 120 divided by the value in ohms of resistor 118.

While only two forms of the present invention have been shown and described, many modifications will be apparent to those skilled in the art and within the spirit and scope of the invention as set forth, in particular, in the appended claims:

1. In a wide-band operational amplifier, the combination of;

a first and a second input terminals;

a first and a second intermediate terminal;

a first and a second output terminal;

a low frequency high input impedance differential transistor amplifier connected between said input terminals and said intermediate terminals and phased to provide amplified input terminal signals to said intermediate terminals with said first terminals of the same first phase and said second terminals of the same second phase;

a high frequency, high gain, low input impedance differential transistor amplifier connected between said intermediate terminals and said output terminals and phased to provide amplified intermediate terminal signals to said output terminals with said first terminals of the same first phase and said second terminals of the same second phase;

first passive capacitative means connected between said first input terminal and said first intermediate terminal and second passive capacitative means connected between said second input terminal and said second intermediate terminal; and a feedback impedance connected from said second output terminal to said first input terminal.

2. A wide-band operational amplifier as set forth in claim 1;

wherein said low frequency amplifier comprises a two stage differential pair transistor amplifier.

3. A wide-band operational amplifier as set forth in claim 1; and including a constant current means connected to supply operating voltage to said low frequency amplifier.

4. In a wide-band operational amplifier, the combination of;

differential input means;

a first differential transistor amplifier stage coupled to said input means;

a second differential transistor amplifier coupled to said first stage;

a third differential transistor amplifier stage coupled to said second stage; and passive high frequency coupling means connected between said input means and the inputs to said third stage with like phase connected to like phase;

wherein said first and second stages are characterized by high input impedance and low high frequency gain and said coupling means are adapted to provide high frequency aiding response to the input to said third stage.

5. A wide-band operational amplifier as set forth in claim 4;

a constant current transistor means connected between the collectors of said first two stages and a source of collector voltage; and a constant current transistor means connected between the emitters of said first two stages and a source of emitter voltage.

6. A wide-band operational amplifier as set forth in claim 4;

including a fourth differential transistor amplifier stage coupled to said third stage; and complementary transistor amplifier output means coupled to said fourth stage for supplying output to a load circuit.

7. A wide-band operational amplifier as set forth in claim 6; and including a degenerative feedback circuit connected between the output of said output means and said input means.

References Cited

UNITED STATES PATENTS

| | | | |
|---|---|---|---|
| 2,529,459 | 11/1950 | Pourciau et al. | 330—98 X |
| 2,752,432 | 6/1956 | Richter | 330—99 X |
| 3,262,066 | 7/1966 | Trilling | 330—30 |
| 3,395,358 | 7/1968 | Petersen | 330—30 |

NATHAN KAUFMAN, Primary Examiner

U.S. Cl. X.R.

330—69, 24